(12) United States Patent
Mantin

(10) Patent No.: US 11,265,106 B1
(45) Date of Patent: Mar. 1, 2022

(54) STREAMING-FRIENDLY TECHNOLOGY FOR DETECTION OF DATA

(71) Applicant: Imperva, Inc., San Mateo, CA (US)

(72) Inventor: Itsik Mantin, Shoham (IL)

(73) Assignee: Imperva, Inc., San Mateo, CA (US)

( * ) Notice: Subject to any disclaimer, the term of this patent is extended or adjusted under 35 U.S.C. 154(b) by 0 days.

(21) Appl. No.: 17/137,340

(22) Filed: Dec. 29, 2020

(51) Int. Cl.
```
H04L 1/00      (2006.01)
H03M 13/00     (2006.01)
H04L 1/18      (2006.01)
```
(52) U.S. Cl.
CPC .......... *H04L 1/0061* (2013.01); *H04L 1/0046* (2013.01); *H04L 1/0075* (2013.01); *H04L 1/1835* (2013.01)

(58) Field of Classification Search
CPC ... H04L 1/0061; H04L 1/0046; H04L 1/0075; H04L 1/1835
See application file for complete search history.

(56) References Cited

U.S. PATENT DOCUMENTS

2004/0117623 A1* 6/2004 Kalogridis ............ H04L 9/3297
713/165
2010/0287402 A1* 11/2010 Kim ........................ H04J 3/067
713/400
2020/0162197 A1* 5/2020 Ma ......................... H04W 28/02

OTHER PUBLICATIONS

"Aho-Corasick algorithm," 4 pages, Wikipedia, downloaded from https://en.wikipedia.org/wiki/Aho-Corasick_algorithm on Dec. 29, 2020.

* cited by examiner

Primary Examiner — Christine T. Tu
(74) Attorney, Agent, or Firm — Nicholson, De Vos, Webster & Elliott, LLP

(57) ABSTRACT

A method by a network device for detecting data in a data stream. The method includes receiving the data stream, where the data stream includes a sequence of original characters, generating a sequence of type-mapped characters corresponding to the sequence of original characters, converging each of two or more consecutive occurrences of a first character in the sequence of type-mapped characters into a single occurrence of the first character, inserting beginning/ending of segment indicators in the sequence of type-mapped characters, searching for occurrences of one or more predefined sequences of characters in the sequence of type-mapped characters, and responsive to finding an occurrence of any of the one or more predefined sequences of characters, extracting a sequence of characters in the sequence of original characters corresponding to the predefined sequence of characters found in the sequence of type-mapped characters.

20 Claims, 4 Drawing Sheets

STREAMING-FRIENDLY TECHNOLOGY FOR DETECTION OF DATA

TECHNICAL FIELD

Embodiments of the invention relate to the field of automated data detection, and more specifically to efficiently detecting data in a data stream in streaming-friendly manner.

BACKGROUND

Digital systems such as web applications and databases often transmit and store sensitive data in a manner that is not always transparent to the data owner or even to the operator of those digital systems. Sensitive data is any type of data that should be protected from unauthorized disclosure such as transactional data (e.g., credit card numbers, bank account numbers, and social security numbers), personal data (e.g., phone numbers, physical/virtual addresses, and medical history), business-related data (e.g., trade secrets, planning information, and financial/accounting information), and/or governmental data (e.g., top-secret information). Thus, there is a need to detect when sensitive data is being transmitted and/or where sensitive data is stored.

Real-time network traffic monitoring systems (e.g., a web application firewall (WAF)) and data protection systems protecting a stream processing system (e.g., Apache Kafka®) may use streaming-friendly processing techniques to detect sensitive data in a data stream. A data stream may include data that is continuously generated (e.g., a sequence of characters). Streaming-friendly processing techniques can incrementally process such data without having access to all of the data. This is in contrast to batch processing techniques that require having access to all of the data to before being able process the data. The use of streaming-friendly processing techniques may be useful for processing data that is generated/received incrementally and for processing large amounts of data (e.g., database discovery and assessment systems, data masking systems, and/or cloud data security systems may need to process the entire data in an enterprise database) where buffering the data for the sake of offline batch processing is expensive (e.g., in terms of the amount of storage/memory that is needed).

A conventional technique for detecting sensitive data in a data stream is to perform regular expression matching operations on the data included in that data stream (e.g., to detect credit card numbers, social security numbers, and/or IDs). However, this typically requires performing a large number of regular expression matching operations on multiple portions of the data included in the data stream (e.g., to detect various different types of sensitive data and the different formats in which the sensitive data may be expressed), which is computationally expensive.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1:
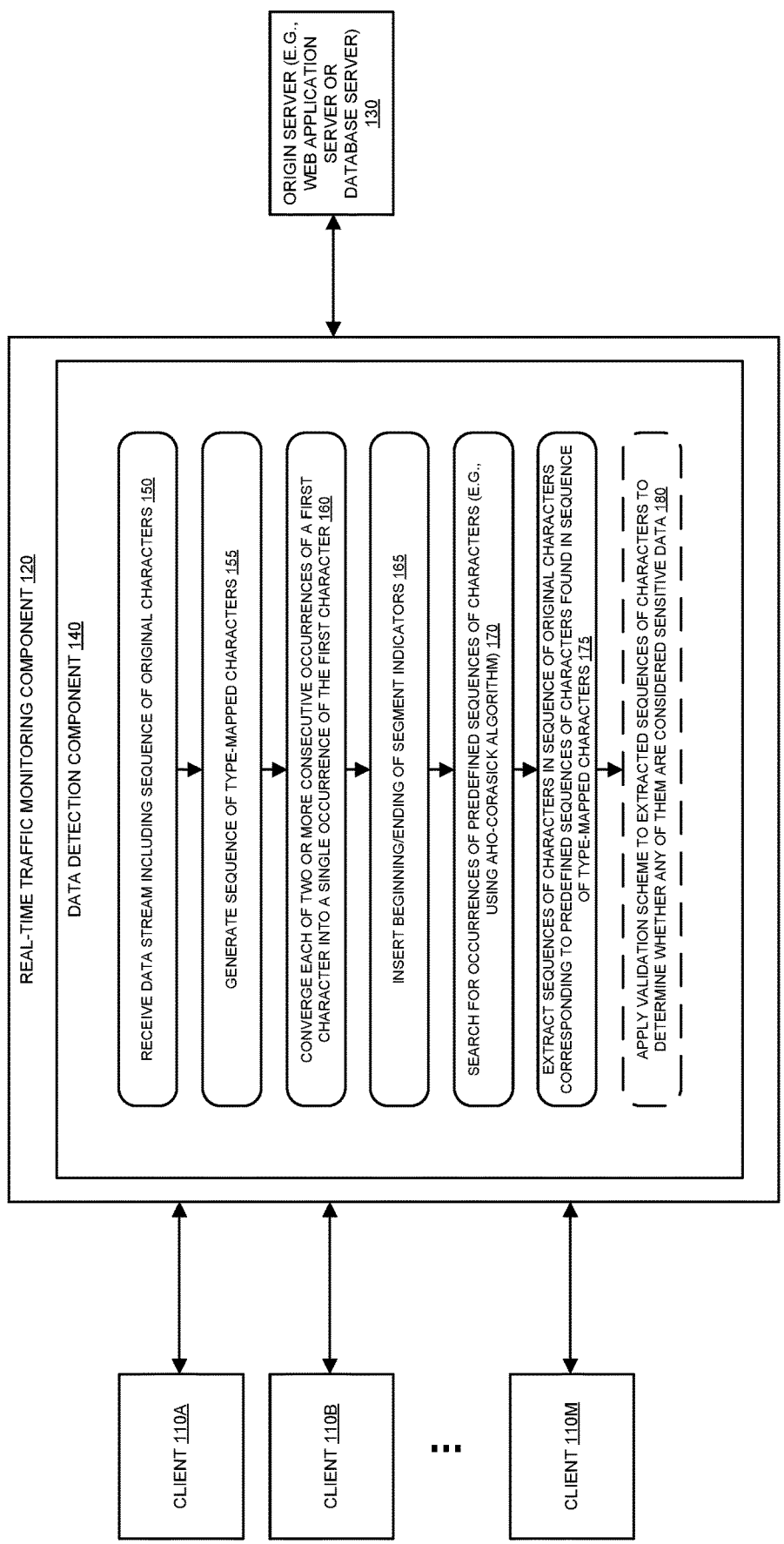
FIG. 1 is a block diagram of a system in which data in a data stream can be detected, according to some embodiments.

In the following description, numerous specific details such as logic implementations, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

Bracketed text and blocks with dashed borders (e.g., large dashes, small dashes, dot-dash, and dots) are used herein to illustrate optional operations that add additional features to embodiments of the invention. However, such notation should not be taken to mean that these are the only options or optional operations, and/or that blocks with solid borders are not optional in certain embodiments of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other As used herein, a network device (e.g., a router, switch, bridge) is an electronic device that is a piece of networking equipment, including hardware and software, which communicatively interconnects other equipment on the network (e.g., other network devices, end stations). Some network devices are "multiple services network devices" that provide support for multiple networking functions (e.g., routing, bridging, and/or switching), and/or provide support for multiple application services (e.g., data, voice, and video).

As used herein, server end stations are network devices operable to execute or otherwise implement one or more servers providing content or services to clients. For example, server end stations may implement application programming interface (API) servers, web application servers, database servers, file servers, print servers, mail servers, gaming servers, application servers, and/or Domain Name System (DNS) servers.

As used herein, client end stations (e.g., workstations, laptops, netbooks, palm tops, mobile phones, smartphones, multimedia phones, Voice over Internet Protocol (VoIP) phones, user equipment (UE), terminals, portable media players, Global Positioning Satellite (GPS) units, gaming systems, set-top boxes) are network devices operable to execute or otherwise implement applications that, among other functions, can access the content and/or services provided by servers over a network (e.g., over a local area network (LAN), over the Internet, and/or over virtual private networks (VPNs) overlaid on (e.g., tunneled through) the Internet).

As mentioned above, a conventional technique for detecting sensitive data in a data stream is to perform regular expression matching operations on the data included in the data stream (e.g., to detect credit card numbers, social security numbers, and/or IDs). However, this typically requires performing a large number of regular expression matching operations on multiple portions of the data included in the data stream (e.g., to detect various different types of sensitive data and the different formats in which the sensitive data may be expressed), which is computationally expensive.

Embodiments are disclosed herein for efficiently detecting sensitive data in a data stream. Embodiments may achieve this by converting a sequence of characters included in the data stream into a format that can be searched more efficiently and then performing a search on the converted sequence of characters. For example, embodiments may detect credit card numbers in a data stream by converting the sequence of characters included in the data stream such that different credit card numbers included in the sequence of characters are converted into the same predefined sequence of characters even if those different credit card numbers are expressed in different formats. Embodiments may then use a streaming-friendly search algorithm (e.g., the Aho-Corasick algorithm) to search for the predefined sequence of characters in the converted sequence of characters. More generally, embodiments may be configured to detect not only sensitive data (e.g., credit card numbers) but any type of data that is expected to be expressed in known formats.

An embodiment is a method by a network device to efficiently detect data in a data stream. The method includes receiving the data stream, where the data stream includes a sequence of original characters, replacing each character in the sequence of original characters with a character representing a character type of that character to generate a sequence of type-mapped characters corresponding to the sequence of original characters, converging each of two or more consecutive occurrences of a first character in the sequence of type-mapped characters into a single occurrence of the first character, inserting a second character immediately before each character in the sequence of type-mapped characters that is determined to be a possible beginning of a segment, inserting a third character immediately after each character in the sequence of type-mapped characters that is determined to be a possible ending of a segment, searching for occurrences of one or more predefined sequences of characters in the sequence of type-mapped characters, and responsive to finding an occurrence of any of the one or more predefined sequences of characters in the sequence of type-mapped characters, extracting a sequence of characters in the sequence of original characters corresponding to the predefined sequence of characters found in the sequence of type-mapped characters.

As will become apparent from the descriptions provided herein, a benefit of the data detection techniques disclosed herein over conventional techniques is that they do not require extensive buffering of data (thereby saving storage/memory resources) and are computationally efficient (e.g., as they do not require performing a large number of regular expression matching operations). Embodiments are further described herein with reference to the accompanying figures.

FIG. 1 is a block diagram of a system in which efficient data detection techniques can be implemented, according to some embodiments. As shown in the diagram, the system includes clients 110A-M, origin server 130, and a traffic monitoring component 120 communicatively coupled between the clients 110A-M and the origin server 130. The clients 110 may access a resource/service provided by the origin server 130, for example, by generating requests (e.g., Hypertext Transfer Protocol (HTTP) request messages or database queries) and sending these requests to the origin server 130 (e.g., over a network such as the interna). The origin server 130 may generate corresponding responses to the received requests (e.g., HTTP response messages or database query results) and send those responses to the clients 110. The clients 110 may then consume the data/contents of the responses according to their respective needs. In one embodiment, the origin server 130 is a web application server. In another embodiment, the origin server 130 is a database server hosting a database. Each of the clients 110 may be implemented using one or more client end stations and the origin server 130 may be implemented using one or more server end stations.

The real-time traffic monitoring component 120 may be deployed between the clients 110 and the origin server 130 (e.g., on the communication path between the clients 110 and the origin server 130) such that it can intercept and inspect the traffic being sent between the clients 110 and the origin server 130. In one embodiment (e.g., an embodiment where the origin server 130 is a web application server), the real-time traffic monitoring component 120 is a web application firewall (WAF) that monitors web application layer requests sent by the clients 110 to the origin server 130 and/or web application responses sent by the origin server 130 to the clients 110. In one embodiment (e.g., an embodiment where the origin server 130 is a database server), the real-time traffic monitoring component 120 is a database activity monitoring (DAM) system that monitors database queries sent by the clients 110 to the origin server 130 and/or database query results sent by the origin server 130 to the clients 110. The real-time traffic monitoring component 120 may be implemented using one or more network devices.

The traffic being sent between the clients 110 and the origin server 130 may potentially include sensitive data such as credit card numbers. As such, there may be a need to detect when sensitive data is being sent between the clients 110 and the origin server 130. Thus, as shown in the diagram, the real-time traffic monitoring component 120 may include a data detection component 140 to efficiently detect sensitive data in a data stream intercepted by the real-time traffic monitoring component 120 in a streaming-friendly manner (e.g., processing one character at a time even before having access to the entire sequence of characters in the data stream). In one embodiment, the data detection component 140 is configured to detect credit card numbers. An example of detecting credit card numbers is used throughout this description to help illustrate the embodiments. It should be understood, however, that the data detection techniques described herein can be used to detect other types of data (e.g., social security numbers, mailing addresses, email addresses, telephone numbers, IDs, etc.). Operations for detecting sensitive data in a data stream are described herein below with reference to blocks 150-180 shown in FIG. 1.

At block 150, the data detection component 140 may receive a data stream including a sequence of characters (this sequence of characters is referred to herein as the "sequence of original characters"). For example, the sequence of original characters may include one or more credit card numbers (which is often considered sensitive data). A 16-digit credit card number may be expressed in multiple different (yet trivial) formats. For example, the 16-digit credit card number "4580111122223333" may be expressed as "4580111122223333", "4580-1111-2222-3333", "4580 1111 2222 3333", "4580　1111　2222　3333" (tabs between the subsequences of four digits), or a similar format. As will be further described herein below, the data detection component 140 may be able to efficiently detect credit card numbers expressed in different formats.

At block 155, the data detection component 140 may generate a sequence of type-mapped characters corresponding to the sequence of original characters. The sequence of type-mapped characters may be generated by replacing each character in the sequence of original characters with a character representing a character type of that character. For example, each alphabet character ('a-z' and 'A-Z') may be replaced with the 'a' character, each digit character ('0-9') may be replaced with the '0' character, and each dash/space/tab character and special character (e.g., a character that does not belong to any of the other categories) may be replaced with the character.

At block 160, the data detection component 140 may converge each of two or more consecutive occurrences of a first character in the sequence of type-mapped characters into a single occurrence of the first character. For example, each of two or more consecutive occurrences of the character in the sequence of type-mapped characters may be converged into a single occurrence of the character. The combination of the type-mapping (of block 155) and the convergence (of block 160) may convert different credit card numbers expressed in different formats into the same predefined sequence of characters. For example, the credit card numbers "4580-1111-2222-3333" and "5111 4444 5555 6666" (which have different digits and different formats) may both be converted into "0000.0000.0000.0000".

At block 165, the data detection component 140 may insert beginning of segment indicators and/or ending of segment indicators into the sequence of type-mapped characters. For example, the 'B' character (where 'B' stands for beginning of segment) may be inserted immediately before each '0' character that occurs immediately after the character. Also, the 'E' character (where 'E' stands for ending of segment) may be inserted immediately after each '0' character that occurs immediately before the character. Stated differently, any occurrence of the sequence of characters '0.0' may be replaced with the sequence of characters '.B0' and any occurrence of the sequence of characters '0.' may be replaced with the sequence of characters '0E.'. Inserting the beginning/ending of segment indicators may help demarcate isolated occurrences of sixteen digits or isolated occurrences of 4-digit subsequences.

At block 170, the data detection component 140 may search for occurrences of predefined sequences of characters in the sequence of type-mapped characters. For example, performing the operations of blocks 155-165 may convert any credit card numbers expressed in any of the formats mentioned above into the predefined sequence of characters "B0000000000000000E" or the predefined sequence of characters "B0000E.B0000E.B0000E.B0000E". Thus, the data detection component 140 may search for occurrences of the predefined sequence of characters "B0000000000000000E" and "B0000E.B0000E.B0000E.B0000E" in the sequence of type-mapped characters to detect credit card numbers.

In one embodiment, the Aho-Corasick algorithm (or similar algorithm) is used to search for occurrences of the predefined sequences of characters. Aho-Corasick algorithm is a streaming-friendly string-searching algorithm that locates a finite set of strings (often referred to as the "dictionary") within an input text. It matches all strings simultaneously. The complexity of the algorithm is linear in the length of the strings plus the length of the searched text plus the number of output matches. Informally, the Aho-Corasick algorithm constructs a finite-state machine that resembles a trie with additional links between the various internal nodes. These extra internal links allow fast transitions between failed string matches (e.g. a search for "cat" in a trie that does not contain "cat," but contains "cart," would fail at the node prefixed by "ca") to other branches of the trie that share a common prefix. This allows the automaton to transition between string matches without the need for backtracking. When the string dictionary is known in advance, the construction of the automaton can be performed once offline and the compiled automaton can be stored for later use. In this case, the run time is linear in the length of the input plus the number of matched entries.

As mentioned above, the combination of the type-mapping (of block 155) and the convergence (of block 160) may convert different credit card numbers expressed in different formats into the same predefined sequence of characters. This simplifies the Aho-Corasick automaton as it does not have to keep track of individual digits (0-9) but only needs to keep track of a smaller subset of characters (e.g., the characters 'a', '0', 'B', and 'E'). Also, the combination of the type-mapping and the convergence simplifies the Aho-Corasick dictionary as it reduces the number of strings (i.e., predefined sequence of characters) that are needed in the dictionary (e.g., the dictionary may include the string "B0000E.B0000E.B0000E.B0000E", which can be used to detect credit card numbers expressed in multiple different formats (e.g., any credit card numbers having subsequences of four digits with dashes/spaces/tabs or special characters between the subsequences)).

At block 175, the data detection component 140 may extract the sequences of characters in the sequence of original characters corresponding to the predefined sequences of characters found in the sequence of type-mapped characters.

In one embodiment, at block 180, the data detection component 140 may apply a validation scheme to the extracted sequences of characters to determine/confirm whether any of the extracted sequences of characters are considered sensitive data. Continuing with the credit card number detection example, the extracted sequences of characters may each conform to a credit card number format but they may not all be valid credit card numbers (e.g., some of them could be 16-digit numbers used for an entirely different purpose). In this sense, the extracted sequences of characters may merely be candidates for being a credit card number. Thus, a validation scheme such as a cyclic redundancy check (CRC), a checksum validation, and/or a Luhn algorithm may be applied to the extracted sequences of characters to determine whether they are actually valid credit card numbers and thus considered sensitive data.

The real-time traffic monitoring component 120 may perform one or more operations in response to the data detection component 140 detecting sensitive data. For example, the real-time traffic monitoring component 120 may notify an administrator regarding the detection of sensitive data, log the detection of sensitive data, mask the sensitive data before sending it, and/or perform any other protective action.

In this manner, embodiments may detect sensitive data in a data stream in a streaming-friendly manner. For example, as described above, embodiments may detect 16-digit credit card numbers that are expressed as sixteen consecutive digits or as subsequences of four digits with dashes, spaces, and/or tabs between them. It should be understood that embodiments can be configured/modified to detect credit card numbers expressed in other formats (e.g., by adding additional/different predefined sequences of characters to the dictionary and/or adding more/different convergence rules). More generally, embodiments can be configured to detect any type of data (whether sensitive or not sensitive) that is expected to be expressed in known formats (e.g., social security numbers, mailing addresses, email addresses, telephone numbers, IDs, etc.).

A benefit of data detection techniques disclosed herein over conventional techniques is that they do not require extensive buffering of data (thereby saving storage/memory resources) and are computationally efficient (e.g., as they do not require performing a large number of regular expression matching operations). While the data detection techniques herein are a natural fit for use in stream processing systems where data is generated/received/processed incrementally, they can also provide similar advantages when used for batch processing. Other benefits will be apparent to one of ordinary skill in the art in view of this disclosure.

One or more components of the system may be deployed in a cloud (e.g., a cloud provided by a cloud provider such as Amazon®, Microsoft®, etc.) and/or on premise (e.g., in an enterprise network). In an exemplary arrangement, the real-time traffic monitoring component 120 (and the data detection component 140 therein) is deployed in a cloud while the origin server 130 is deployed on-premise (in an enterprise network), and any requests originated by the clients 110 that are intended for the origin server 130 are first directed to the real-time traffic monitoring component 120 in the cloud before being sent to the on-premise origin server 130. It should be understood that other arrangements are also possible. For example, both the real-time traffic monitoring component 120 and the origin server 130 may be deployed in the cloud or both may be deployed on-premise.

Figure 2:
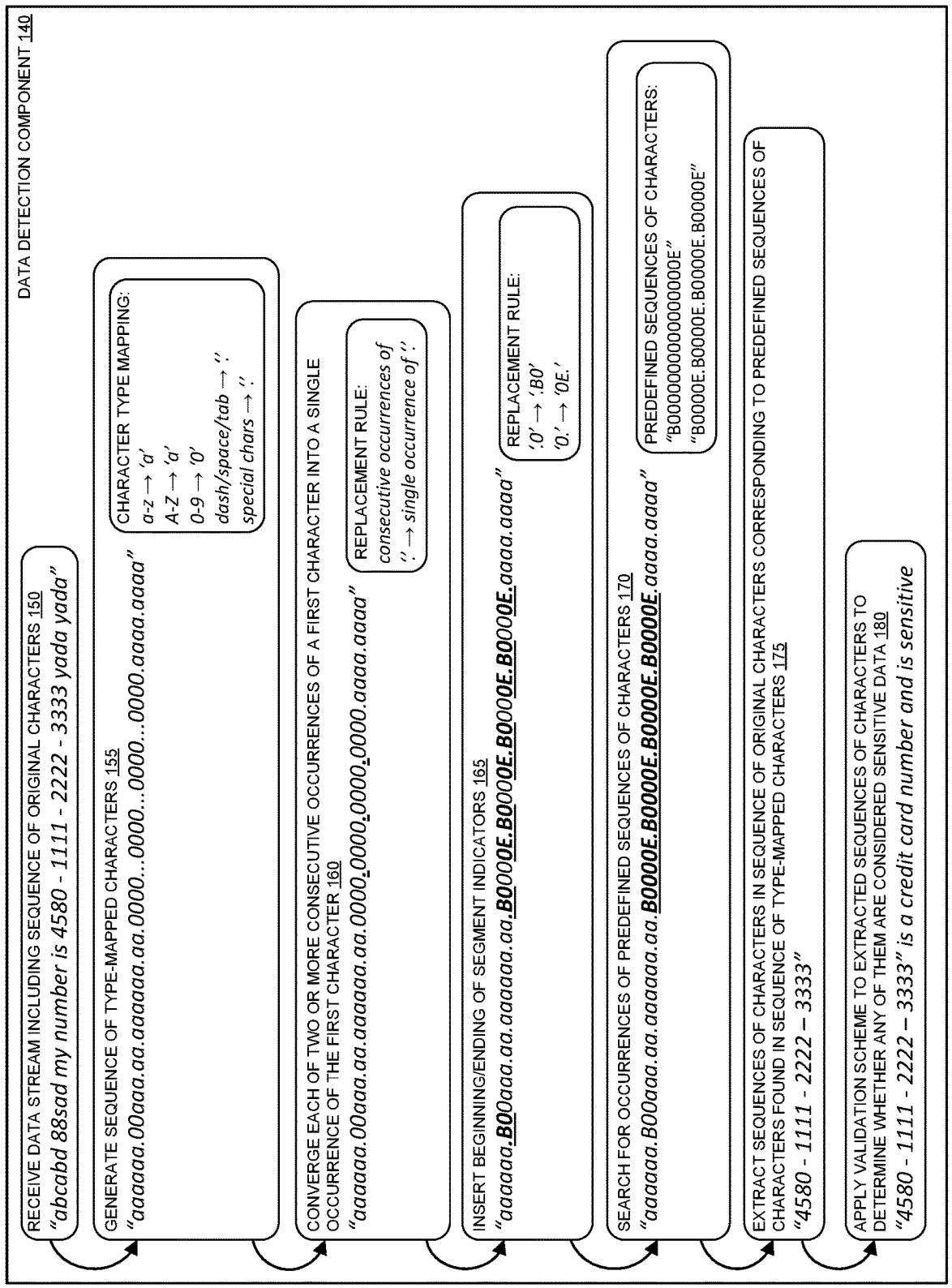
FIG. 2 is a diagram illustrating an example of detecting credit card numbers in a data stream, according to some embodiments.

FIG. 2 is a diagram illustrating an example of detecting credit card numbers in a data stream, according to some embodiments. At block 150, the data detection component 140 receives a data stream including a sequence of original characters. As shown in the diagram, in this example, the sequence of original characters that is received is "abcabd 88sad my number is 4580-1111-2222-3333 yada yada".

At block 155, the data detection component 140 generates a sequence of type-mapped characters. As shown in the diagram, in this example, the character type mapping maps alphabet characters ('a-z' and 'A-Z') to the 'a' character, digit characters ('0-9') to the '0' character, and dash/space/tab characters and special characters to the character. Thus, in this example, the sequence of type-mapped characters corresponding to the sequenced of original characters is "aaaaaa.00aaa.aa.aaaaaa.aa.0000 . . . 0000 . . . 0000 . . . 0000.aaaa.aaaa" (each character in the sequence of original characters is replaced with a character representing the character type of that character in accordance with the character type mapping).

At block 160, the data detection component 140 converges each of two or more occurrences of a first character into a single occurrence of the first character. As shown in the diagram, in this example, the convergence replacement rule is to replace consecutive occurrences of the character with a single occurrence of the character. Thus, in this example, sequence of type-mapped characters is updated to be "aaaaaa.00aaa.aa.aaaaaa.aa.0000.0000.0000.0000.aaaa.aaaa" (the locations where the replacements occurred are underlined in the diagram).

At block 165, the data detection component 140 inserts beginning/ending of segment indicators. As shown in the diagram, in this example, the beginning/ending of segment indicator replacement rule is to replace the sequence of characters '0.0' with the sequence of characters '.B0' and to replace the sequence of characters '0.' with the sequence of characters '0E'. Thus, in this example, the sequence of type-mapped characters is updated to be "aaaaaa.B00aaa.aa.aaaaaa.aa.B0000E.B0000E.B0000E.B0000E.aaaa.aaaa" (the locations where the replacements occurred are underlined in the diagram).

At block 170, the data detection component 140 searches for occurrences of predefined sequences of characters. As shown in the diagram, in this example, the predefined sequences of characters are "B0000000000000000E" and "B0000E.B0000E.B0000E.B0000E". In this example, the predefined sequence of characters "B0000E.B0000E.B0000E.B0000E" is found in the sequence of type-mapped characters (this predefined sequence of characters is underlined in the diagram).

At block 175, the data detection component 140 extracts sequences of characters in the sequence of original characters corresponding to the predefined sequences of characters found in the sequence of type-mapped characters. As shown in the diagram, in this example, the sequence of original characters corresponding to the predefined sequence of characters that was found is "4580-1111-2222-3333".

At block 180, the data detection component 140 applies a validation scheme to the extracted sequences of characters to determine whether any of them are considered sensitive data. In this example, a validation scheme (e.g., Luhn algorithm) is applied to the extracted sequence of characters "4580-1111-2222-3333" and it is determined that this is a valid credit card number, and thus is considered sensitive data.

Figure 3:
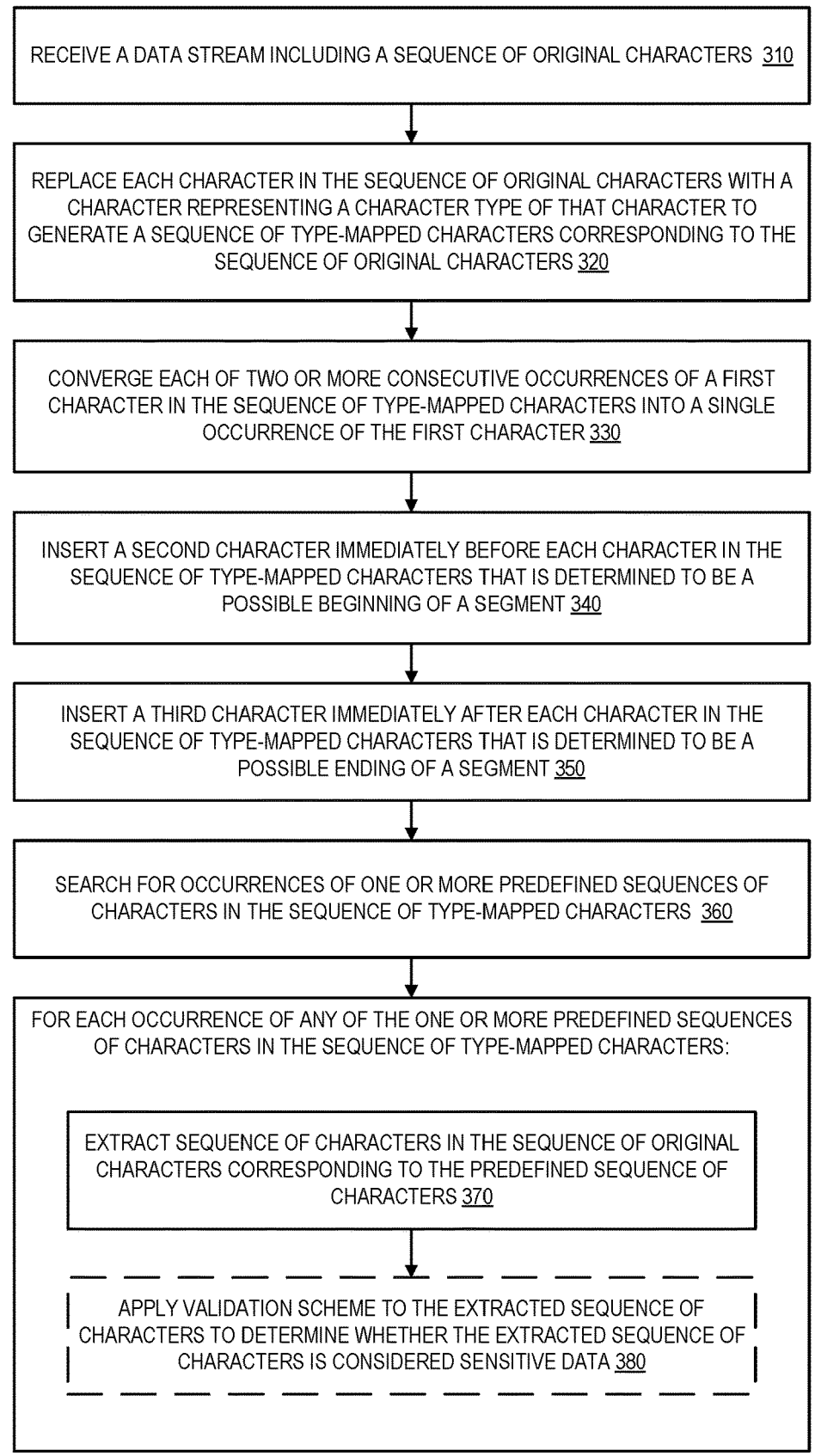
FIG. 3 is a flow diagram of a process for detecting data in a data stream, according to some embodiments.

FIG. 3 is a flow diagram of a process for detecting data in a data stream, according to some embodiments. In one embodiment, the process is implemented by a network device. In one embodiment, the network device implements a real-time traffic monitoring component 120 (e.g., a WAF or database activity monitoring system) that is communicatively coupled between one or more clients 110 and an origin server 130. The process may be implemented using hardware, software, firmware, or any combination thereof.

The operations in the flow diagram are described with reference to the exemplary embodiments of the other diagrams. However, it should be understood that the operations of the flow diagram can be performed by embodiments other than those discussed with reference to these other diagrams, and the embodiments discussed with reference to these other diagrams can perform operations different than those discussed with reference to the flow diagram. Also, while the flow diagram shows a particular order of operations performed by certain embodiments, it should be understood that such order is exemplary (e.g., alternative embodiments may perform the operations in a different order, combine certain operations, overlap certain operations, etc.).

At block 310, the network device receives a data stream including a sequence of original characters.

At block 320, the network device replaces each character in the sequence of original characters with a character representing a character type of that character to generate a sequence of type-mapped characters corresponding to the sequence of original characters.

At block 330, the network device converges each of two or more consecutive occurrences of a first character (e.g., the character) in the sequence of type-mapped characters into a single occurrence of the first character.

At block 340, the network device inserts a second character (e.g., the 'B' character) immediately before each character in the sequence of type-mapped characters that is determined to be a possible beginning of a segment.

At block 350, the network device inserts a third character (e.g., the 'E' character) immediately after each character in the sequence of type-mapped characters that is determined to be a possible ending of a segment.

At block 360, the network device searches for occurrences of one or more predefined sequences of characters in the sequence of type-mapped characters. In one embodiment, an Aho-Corasick algorithm is used to search for the one or more predefined sequences of characters in the sequence of type-mapped characters.

For each occurrence of any of the one or more predefined sequences of characters in the sequence of type-mapped characters, at block 370, the network device extracts the sequence of characters in the sequence of original characters corresponding to the predefined sequence of characters that was found. Also, in one embodiment, at block 380, the network device applies a validation scheme to the extracted sequence of characters to determine whether the extracted sequence of characters is considered sensitive data (or to otherwise determine/confirm that the extracted sequence of characters is indeed a the type of data is being detected). In one embodiment, the validation scheme includes one or more of: a cyclic redundancy check (CRC), a checksum validation, and a Luhn algorithm.

In one embodiment, the sequence of type-mapped characters includes at least the first character (e.g., the character) and a fourth character (e.g., the '0' character), where the first character represents a special character type (and/or dash/space/tab character type) and the fourth character represents a digit character type. In one embodiment, the second character (e.g., the 'B' character) is inserted immediately before each fourth character in the sequence of type-mapped characters when that fourth character occurs immediately after the first character (e.g., "0.0" is replaced with ".B0", where the 'B' character demarcates a possible beginning of a segment). In one embodiment, the third character is inserted immediately after each fourth character in the sequence of type-mapped characters that occurs immediately before the first character (e.g., "0." is replaced with "0E.", where the 'E' character demarcates a possible ending of a segment). In one embodiment, each the one or more predefined character sequences includes exactly sixteen occurrences of the fourth character, where the one or more predefined character sequences are used to detect candidates for credit card numbers. In one embodiment, the sequence of original characters is processed by the network device in streaming fashion without buffering the sequence of original characters in its entirety.

Figure 4:
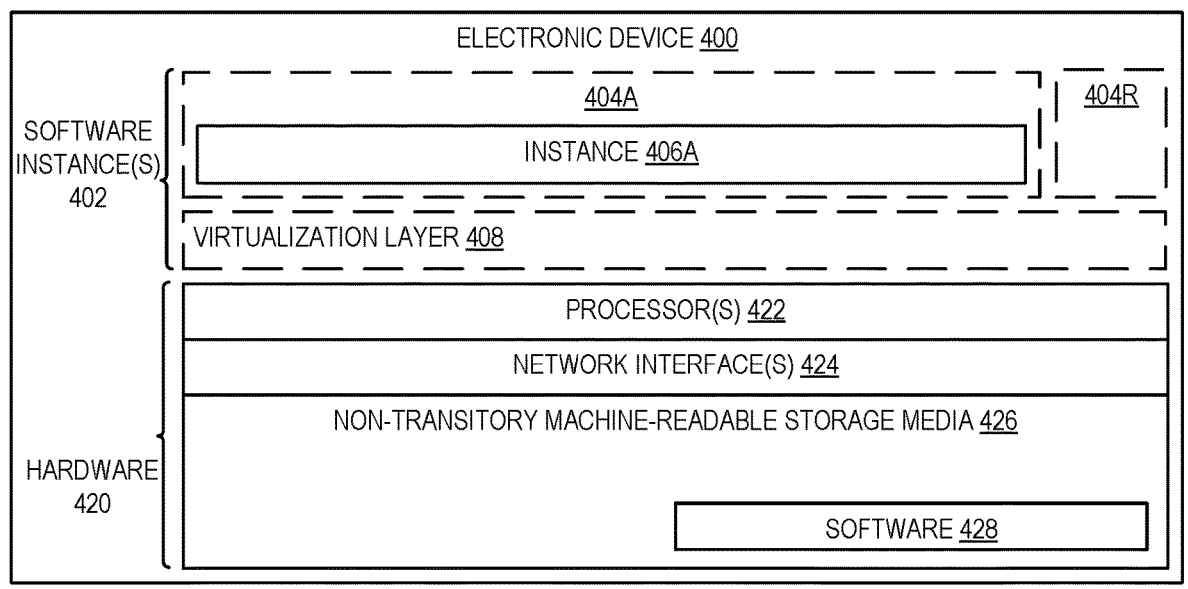
FIG. 4 is a block diagram illustrating an electronic device, according to some embodiments.

FIG. 4 is a block diagram illustrating an electronic device, according to some embodiments. FIG. 4 illustrates hardware 420 comprising a set of one or more processor(s) 422, a set of one or more network interfaces 424 (wireless and/or wired), and non-transitory machine-readable storage medium/media 426 having stored therein software 428 (which includes instructions executable by the set of one or more processor(s) 422). Software 428 can include code, which when executed by hardware 420, causes the electronic device 400 to perform operations of one or more embodiments described herein (e.g., operations for detecting data in a data stream). Thus, the traffic monitoring component 120 may be implemented by one or more electronic devices.

In electronic devices that use compute virtualization, the set of one or more processor(s) 422 typically execute software to instantiate a virtualization layer 408 and software container(s) 404A-R (e.g., with operating system-level virtualization, the virtualization layer 408 represents the kernel of an operating system (or a shim executing on a base operating system) that allows for the creation of multiple software containers 404A-R (representing separate user space instances and also called virtualization engines, virtual private servers, or jails) that may each be used to execute a set of one or more applications; with full virtualization, the virtualization layer 408 represents a hypervisor (sometimes referred to as a virtual machine monitor (VMM)) or a hypervisor executing on top of a host operating system, and the software containers 404A-R each represent a tightly isolated form of a software container called a virtual machine that is run by the hypervisor and may include a guest operating system; with para-virtualization, an operating system or application running with a virtual machine may be aware of the presence of virtualization for optimization purposes). Again, in electronic devices where compute virtualization is used, during operation an instance of the software 428 (illustrated as instance 406A) is executed within the software container 404A on the virtualization layer 408. In electronic devices where compute virtualization is not used, the instance 406A on top of a host operating system is executed on the "bare metal" electronic device 400. The instantiation of the instance 406A, as well as the virtualization layer 408 and software containers 404A-R if implemented, are collectively referred to as software instance(s) 402.

Alternative implementations of an electronic device may have numerous variations from that described above. For example, customized hardware and/or accelerators might also be used in an electronic device.

The techniques shown in the figures can be implemented using code and data stored and executed on one or more electronic devices (e.g., an end station, a network device). Such electronic devices, which are also referred to as computing devices, store and communicate (internally and/or with other electronic devices over a network) code and data using computer-readable media, such as non-transitory machine-readable storage media (e.g., magnetic disks, optical disks, random access memory (RAM), read-only memory (ROM); flash memory, phase-change memory) and transitory computer-readable communication media (e.g., electrical, optical, acoustical or other form of propagated signals, such as carrier waves, infrared signals, digital signals). In addition, electronic devices include hardware, such as a set of one or more processors coupled to one or more other components, e.g., one or more non-transitory machine-readable storage media to store code and/or data, and a set of one or more wired or wireless network interfaces allowing the electronic device to transmit data to and receive data from other computing devices, typically across one or more networks (e.g., Local Area Networks (LANs), the Internet). The coupling of the set of processors and other components is typically through one or more interconnects within the electronic device, (e.g., busses, bridges). Thus, the non-transitory machine-readable storage media of a given electronic device typically stores code (i.e., instructions) for execution on the set of one or more processors of that electronic device. Of course, various parts of the various embodiments presented herein can be implemented using different combinations of software, firmware, and/or hardware. As used herein, a network device (e.g., a router, switch, bridge) is an electronic device that is a piece of networking equipment, including hardware and software, which communicatively interconnects other equipment on the network (e.g., other network devices, end stations). Some network devices are "multiple services network devices" that provide support for multiple networking functions (e.g., routing, bridging, switching), and/or provide support for multiple application services (e.g., data, voice, and video).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method by a network device to efficiently detect data in a data stream, the method comprising:
   receiving the data stream, wherein the data stream includes a sequence of original characters;
   replacing each character in the sequence of original characters with a character representing a character type of that character to generate a sequence of type-mapped characters corresponding to the sequence of original characters;
   converging each of two or more consecutive occurrences of a first character in the sequence of type-mapped characters into a single occurrence of the first character;
   inserting a second character immediately before each character in the sequence of type-mapped characters that is determined to be a possible beginning of a segment;
   inserting a third character immediately after each character in the sequence of type-mapped characters that is determined to be a possible ending of a segment;
   searching for occurrences of one or more predefined sequences of characters in the sequence of type-mapped characters; and
   responsive to finding an occurrence of any of the one or more predefined sequences of characters in the sequence of type-mapped characters, extracting a sequence of characters in the sequence of original characters corresponding to the occurrence of the predefined sequence of characters found in the sequence of type-mapped characters.

2. The method of claim 1, wherein an Aho-Corasick algorithm is used to search for the occurrences of the one or more predefined sequences of characters in the sequence of type-mapped characters.

3. The method of claim 1, further comprising:
   applying a validation scheme to the extracted sequence of characters to determine whether the extracted sequence of characters is considered sensitive data.

4. The method of claim 3, wherein the validation scheme includes one or more of: a cyclic redundancy check (CRC), a checksum validation, and a Luhn algorithm.

5. The method of claim 3, wherein the sequence of type-mapped characters includes at least an occurrence of the first character and an occurrence of a fourth character, wherein the first character represents a special character type and the fourth character represents a digit character type.

6. The method of claim 5, wherein the second character is inserted immediately before each an occurrence of the fourth character in the sequence of type-mapped characters when that fourth character occurs immediately after the first character.

7. The method of claim 6, wherein the third character is inserted immediately after each occurrence of the fourth character in the sequence of type-mapped characters that occurs immediately before the first character.

8. The method of claim 7, wherein each the one or more predefined character sequences includes exactly sixteen occurrences of the fourth character, wherein the one or more predefined character sequences are used to detect candidates for credit card numbers.

9. The method of claim 1, wherein the sequence of original characters is processed by the network device in streaming fashion without buffering the sequence of original characters in its entirety.

10. A set of one or more non-transitory machine-readable storage media storing instructions which, when executed by one or more processors of one or more network devices, causes the one or more network devices to perform operations for detecting data in a data stream, the operations comprising:
    receiving the data stream, wherein the data stream includes a sequence of original characters;
    replacing each character in the sequence of original characters with a character representing a character type of that character to generate a sequence of type-mapped characters corresponding to the sequence of original characters;
    converging each of two or more consecutive occurrences of a first character in the sequence of type-mapped characters into a single occurrence of the first character;
    inserting a second character immediately before each character in the sequence of type-mapped characters that is determined to be a possible beginning of a segment;
    inserting a third character immediately after each character in the sequence of type-mapped characters that is determined to be a possible ending of a segment;
    searching for occurrences of one or more predefined sequences of characters in the sequence of type-mapped characters; and
    responsive to finding an occurrence of any of the one or more predefined sequences of characters in the sequence of type-mapped characters, extracting a sequence of characters in the sequence of original characters corresponding to the occurrence of the predefined sequence of characters found in the sequence of type-mapped characters.

11. The set of one or more non-transitory machine-readable storage media of claim 10, wherein an Aho-Corasick algorithm is used to search for the occurrences of the one or more predefined sequences of characters in the sequence of type-mapped characters.

12. The set of one or more non-transitory machine-readable storage media of claim 10, wherein the operations further comprise:

applying a validation scheme to the extracted sequence of characters to determine whether the extracted sequence of characters is considered sensitive data.

13. The set of one or more non-transitory machine-readable storage media of claim 10, wherein the sequence of type-mapped characters includes at least an occurrence of the first character and an occurrence of a fourth character, wherein the first character represents a special character type and the fourth character represents a digit character type.

14. The set of one or more non-transitory machine-readable storage media of claim 13, wherein the second character is inserted immediately before each occurrence of the fourth character in the sequence of type-mapped characters when that fourth character occurs immediately after the first character.

15. The set of one or more non-transitory machine-readable storage media of claim 14, wherein the third character is inserted immediately after each occurrence of the fourth character in the sequence of type-mapped characters that occurs immediately before the first character.

16. A network device configured to detect data in a data stream, the network device comprising:
  one or more processors; and
  a non-transitory machine-readable storage medium having instructions stored therein, which when executed by the one or more processors, causes the network device to:
    receive the data stream, wherein the data stream includes a sequence of original characters,
    replace each character in the sequence of original characters with a character representing a character type of that character to generate a sequence of type-mapped characters corresponding to the sequence of original characters,
    converge each of two or more consecutive occurrences of a first character in the sequence of type-mapped characters into a single occurrence of the first character,
    insert a second character immediately before each character in the sequence of type-mapped characters that is determined to be a possible beginning of a segment,
    insert a third character immediately after each character in the sequence of type-mapped characters that is determined to be a possible ending of a segment,
    search for occurrences of one or more predefined sequences of characters in the sequence of type-mapped characters, and
    responsive to finding an occurrence of any of the one or more predefined sequences of characters in the sequence of type-mapped characters, extract a sequence of characters in the sequence of original characters corresponding to the occurrence of the predefined sequence of characters found in the sequence of type-mapped characters.

17. The network device of claim 16, wherein an Aho-Corasick algorithm is used to search for the occurrences of the one or more predefined sequences of characters in the sequence of type-mapped characters.

18. The network device of claim 16, wherein the instructions, which when executed by the one or more processors, further causes the network device to:
  apply a validation scheme to the extracted sequence of characters to determine whether the extracted sequence of characters is considered sensitive data.

19. The network device of claim 18, wherein the validation scheme includes one or more of:
  a cyclic redundancy check (CRC), a checksum validation, and a Luhn algorithm.

20. The network device of claim 16, wherein the network device is to process the sequence of original characters in streaming fashion without buffering the sequence of original characters in its entirety.

* * * * *